United States Patent
Watanabe (10) Patent No.: US 7,102,269 B2
(45) Date of Patent: Sep. 5, 2006

(54) SURFACE ACOUSTIC WAVE DEVICE

(75) Inventor: Norio Watanabe, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 146 days.

(21) Appl. No.: 10/822,339

(22) Filed: Apr. 12, 2004

(65) Prior Publication Data

US 2004/0233021 A1 Nov. 25, 2004

(30) Foreign Application Priority Data

May 19, 2003 (JP) ............................. 2003-140534

(51) Int. Cl.
- *H03H 9/64* (2006.01)
- *H03H 9/58* (2006.01)
- *H03H 9/25* (2006.01)
- *H03H 9/145* (2006.01)

(52) U.S. Cl. .................. 310/313 D; 333/195
(58) Field of Classification Search ............ 310/313 R, 310/313 D; 333/193–195
See application file for complete search history.

(56) References Cited

U.S. PATENT DOCUMENTS

| 5,559,483 | A | * | 9/1996 | Kajihara et al. ............ 333/195 |
| 5,666,092 | A | * | 9/1997 | Yamamoto et al. ......... 333/194 |
| 5,909,158 | A | * | 6/1999 | Hiramoto .................... 333/195 |
| 2004/0061575 | A1 | * | 4/2004 | Kando et al. ............... 333/195 |
| 2004/0164645 | A1 | * | 8/2004 | Oshio ..................... 310/313 B |

FOREIGN PATENT DOCUMENTS

| JP | 06-334476 | 12/1994 |
| JP | 07-058585 | 3/1995 |
| JP | 10-242801 | 9/1998 |
| JP | 11-168350 | 6/1999 |

* cited by examiner

*Primary Examiner*—Thomas M. Dougherty
(74) *Attorney, Agent, or Firm*—Keating & Bennett, LLP (57) ABSTRACT

A surface acoustic wave device includes first and second surface acoustic wave resonator filters connected in parallel to each other. The first double-mode surface acoustic wave resonator filter has resonance frequencies f1L and f1H and the second double-mode surface acoustic wave resonator filter has resonance frequencies f2L and f2H, where f1H=f2L. A Q factor of a resonance mode of one of the first and the second double-mode surface acoustic wave resonator filter is less than that of the other surface acoustic wave resonator filter, or an energy transmittance of the reflectors in at least one of the first and the second surface acoustic wave resonator filters ranges from about 12% to about 28%.

16 Claims, 11 Drawing Sheets

SURFACE ACOUSTIC WAVE DEVICE

BACKGROUND OF THE INVENTION

1. Field of the Invention

The present invention relates to a surface acoustic wave device for use as, for example, a band pass filter and, more particularly, to a surface acoustic wave device having a first surface acoustic wave resonator filter connected in parallel to a second surface acoustic wave resonator filter.

2. Description of the Related Art

Various types of surface acoustic wave devices including a plurality of surface acoustic wave resonator filters that are connected in parallel to one another have been proposed. For example, Japanese Unexamined Patent Application Publication No. 6-334476 (hereinafter referred to as Patent Document 1) discloses a surface acoustic wave device including a plurality of IDT electrodes that are provided on a quartz substrate and a first surface acoustic wave resonator filter including the IDT electrodes that is connected in parallel to a second surface acoustic wave resonator filter also including the IDT electrodes. Herein, filter characteristics of the parallel-connected surface acoustic wave resonator filters are shifted towards each other to achieve a wide-band filter characteristic of a surface acoustic wave device.

Figure 10:
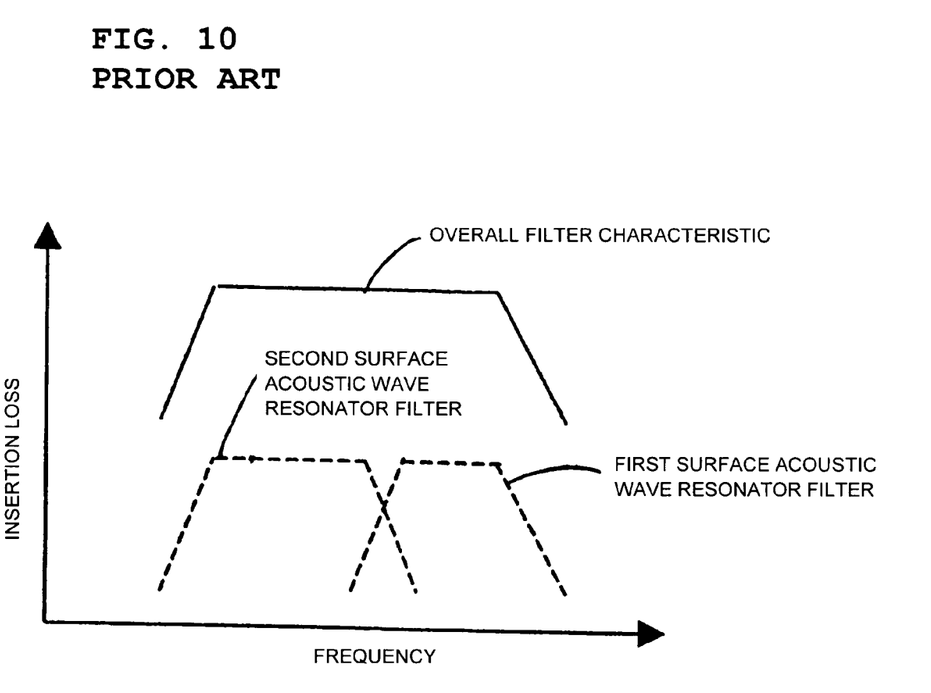
FIG. 10 shows filter characteristics of first and second surface acoustic wave resonator filters, and the overall filter characteristic of an example of a known surface acoustic wave device.

FIG. 10 shows an example of a filter characteristic of such a known surface acoustic wave device.

Figure 11:
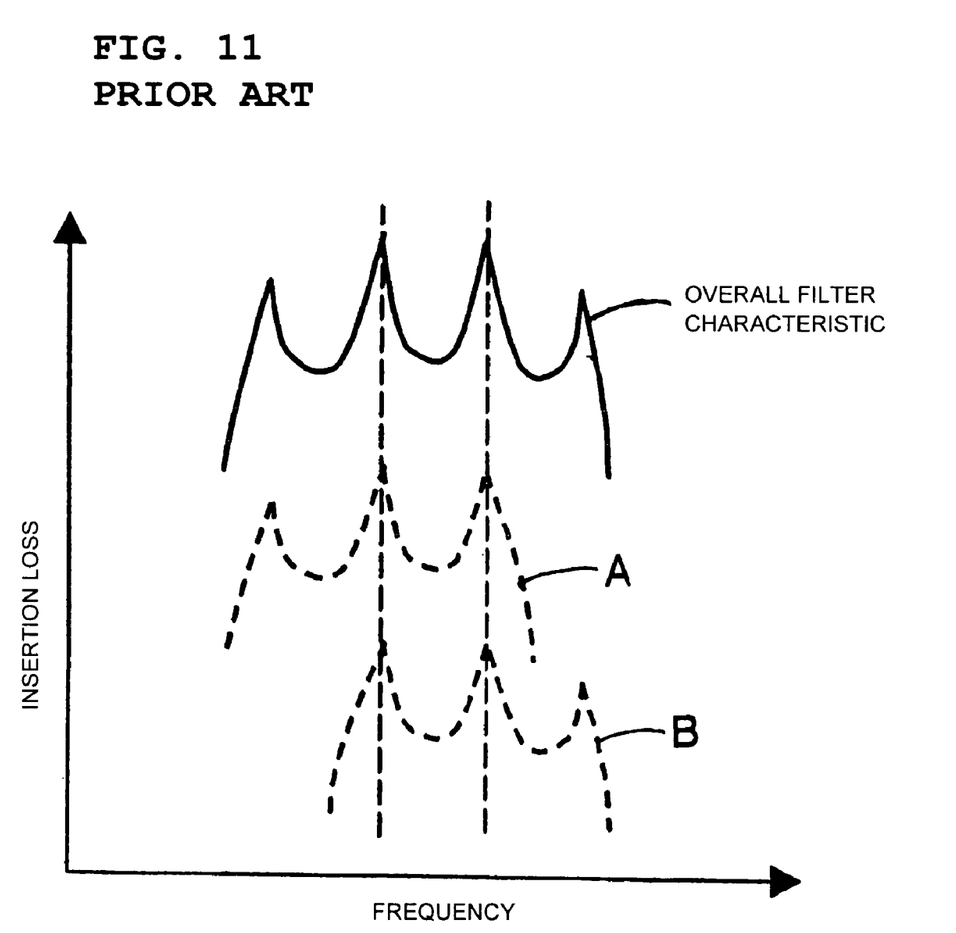
FIG. 11 shows filter characteristics of first and second surface acoustic wave resonator filters, and the overall filter characteristic of another example of a known surface acoustic wave device.

On the other hand, Japanese Unexamined Patent Application Publication No. 7-58585 (hereinafter referred to as Patent Document 2) discloses a surface acoustic wave device that is similar to the surface acoustic wave device disclosed in Patent Document 1. However, the relationship of filter characteristics of parallel-connected surface acoustic wave resonator filters disclosed in Patent Document 2 differs from that in Patent Document 1. That is, with reference to FIG. 11, a first characteristic and a second characteristic of the surface acoustic wave resonator filters are shown by dashed lines A and B, respectively. The overall filter characteristic of the surface acoustic wave device is shown by a solid line. As can be seen from the dashed lines A and B, each surface acoustic wave resonator has three different resonance points of a longitudinal mode. In the surface acoustic wave device in Patent Document 2, two resonance points on the high frequency side of one surface acoustic wave resonator filter are brought into coincidence with two resonance points on the low frequency side of the other surface acoustic wave resonator filter. Thus, the overall filter characteristic of the surface acoustic wave device is obtained.

To construct a longitudinally coupled surface acoustic wave resonator filter, a plurality of surface acoustic wave resonator filters are connected in parallel on a piezoelectric substrate, as disclosed in Patent Documents 1 and 2, as is well known. Such a structure decreases an impedance of the surface acoustic wave filter. In addition, a wide-band filter characteristic is achieved by shifting the filter characteristics of the surface acoustic wave resonator filters towards each other, as disclosed in Patent Documents 1 and 2.

Unfortunately, although a wide-band filter characteristic is achieved by shifting the filter characteristics of the first and second surface acoustic wave resonator filters towards each other, an undesired ripple is produced in the overall filter characteristic.

On the other hand, as disclosed in Patent Document 2, overlapping of a plurality of resonance points in the filter characteristics of the first and second surface acoustic wave resonator filters suppresses the undesired ripple. However, even in this design, a ripple occurs sometimes due to variations in manufacturing under some design conditions. That is, the ripple may occur if the overlapped resonance points are offset and a continuity of the phase is lost. In particular, in the case of a high Q factor of the resonance point, namely, in the case of a steep change in the phase, a slight offset of the overlapped resonance points significantly shifts the phase, thereby generating a ripple.

SUMMARY OF THE INVENTION

To overcome the problems described above, preferred embodiments of the present invention provide a surface acoustic wave device having first and second double-mode surface acoustic wave resonator filters connected in parallel, having a wide-band filter characteristic, and also reliably suppressing an undesired ripple.

According to a first preferred embodiment of the present invention, a surface acoustic wave device includes a first and a second double-mode surface acoustic wave resonator filter connected in parallel to each other, each including a piezoelectric substrate, IDT electrodes and grating reflectors on the piezoelectric substrate, wherein the first double-mode surface acoustic wave resonator filter has resonance frequencies f1L and f1H, where f1L<f1H, the second double-mode surface acoustic wave resonator filter has resonance frequencies f2L and f2H, where f2L<f2H, f1H=f2L, and an energy transmittance of the reflectors in at least one of the first and the second double-mode surface acoustic wave resonator filters ranges from about 12% to about 28%. Accordingly, in the overall filter characteristic, in which resonance points of the first and the second double-mode surface acoustic wave resonator filters are brought into coincidence to obtain a wide bandwidth, a change of phase characteristic is greatly reduced, thereby efficiently minimizing a passband ripple.

According to a second preferred embodiment of the present invention, a surface acoustic wave device includes a first and a second double-mode surface acoustic wave resonator filters connected in parallel to each other, each including a piezoelectric substrate, IDT electrodes on the piezoelectric substrate, and grating reflectors on both sides of a region where the IDT electrodes are disposed in the surface acoustic wave propagation direction, wherein the first double-mode surface acoustic wave resonator filter has resonance frequencies f1L and f1H, where f1L<f1H, the second double-mode surface acoustic wave resonator filter has resonance frequencies f2L and f2H, where f2L<f2H, f1H=f2L, and a Q factor of a resonance mode of one of the first and the second double-mode surface acoustic wave resonator filter is less than a Q factor of a resonance mode of the other double-mode surface acoustic wave resonator filter. Accordingly, in the overall filter characteristic, in which resonance points of the first and the second double-mode surface acoustic wave resonator filters are brought into coincidence to obtain a wide bandwidth, a change of phase characteristic is greatly reduced, thereby efficiently minimizing a passband ripple.

According to the first and the second preferred embodiments of the present invention, a fractional bandwidth that is a ratio of a passband to the center frequency of the passband is preferably in a range from about 0.18% to about 0.22%. As a result, a wide-band filter characteristic that suppresses a passband ripple is obtained.

According to the first and second preferred embodiments of the present invention, the piezoelectric substrate is preferably a quartz substrate.

According to still another preferred embodiment of the present invention, in the surface acoustic wave device, the first surface acoustic wave resonator filter and the second surface acoustic wave resonator filter are preferably disposed on the same piezoelectric substrate. Accordingly, a surface acoustic wave device that suppresses a passband ripple is provided as a component defined by one element.

Other features, elements, characteristics and advantages of the present invention will become more apparent from the following detailed description of preferred embodiments with reference to the attached drawings.

DETAILED DESCRIPTION OF PREFERRED EMBODIMENTS

Preferred embodiments of the present invention will now be described.

First Preferred Embodiment

Figure 1:
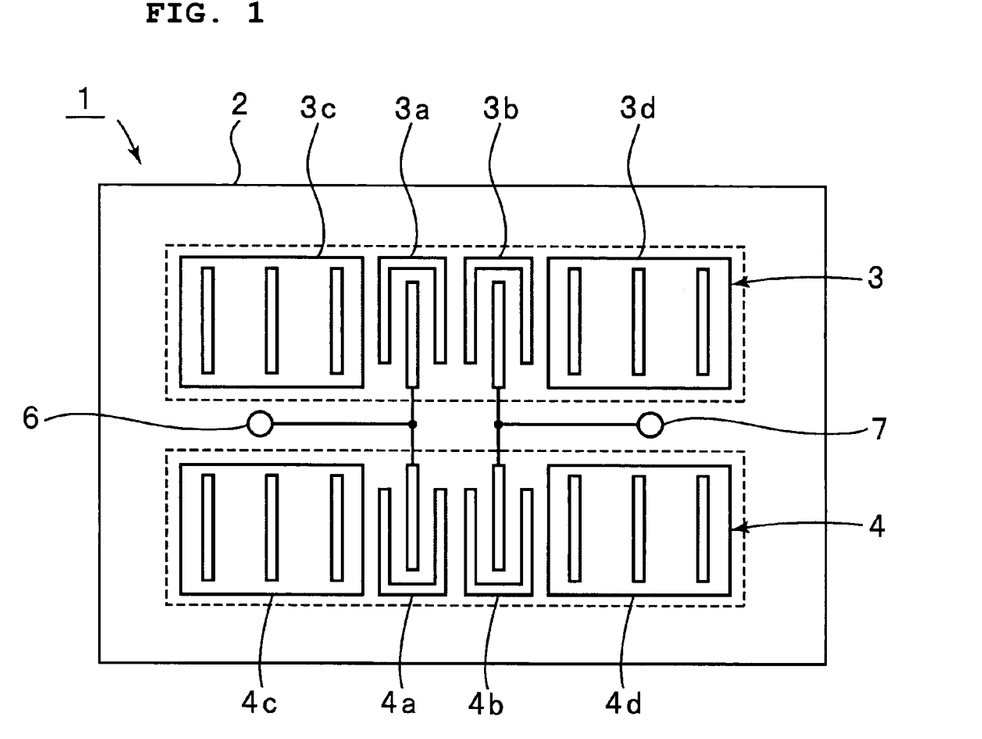
FIG. 1 is a schematic plan view of a surface acoustic wave device according to a first preferred embodiment of the present invention.

FIG. 1 is a schematic plan view of a surface acoustic wave device according to a first preferred embodiment of the present invention. A surface acoustic wave device 1 includes first and second double-mode surface acoustic wave resonator filters 3 and 4 on a piezoelectric substrate 2. In this preferred embodiment, the piezoelectric substrate 2 is made of a quartz crystal, however, it may be made of another piezoelectric single crystal, such as $LiTaO_3$ or $LiNbO_3$ or other suitable material.

The first surface acoustic wave resonator filter 3 includes IDT electrodes 3a and 3b, and grating reflectors 3c and 3d respectively disposed on both sides of a region of the IDT electrodes 3a and 3b in a surface acoustic wave propagation direction. Similarly, the second surface acoustic wave resonator filter 4 includes IDT electrodes 4a and 4b, and grating reflectors 4c and 4d.

In this preferred embodiment, the IDT electrodes 3a, 3b, 4a and 4b and the grating reflectors 3c, 3d, 4c and 4d are preferably made from coated metal primarily containing Al. The thickness of the metal film is about 3% of a wavelength of a selected surface acoustic wave. A duty ratio of the IDT electrodes 3a, 3b, 4a and 4b and the grating reflectors 3c, 3d, 4c and 4d is preferably about 0.55. The term "duty ratio" as used herein refers to a ratio of a width of an electrode finger versus a sum of the width and a gap between the electrode fingers.

Each IDT electrode 3a, 3b, 4a or 4b includes 68 pairs of electrode fingers.

A center-to-center distance between the fingers of the IDT electrodes 3a and 3b is about $1.25\lambda$, where $\lambda$ is a wavelength of the reflectors 3c and 3d. A center-to-center distance between the fingers of the IDT electrodes 3a and the reflectors 3c is preferably about $0.52\lambda$. Also, a center-to-center distance between the fingers of the IDT electrodes 3b and the reflectors 3d is preferably about $0.52\lambda$.

The number of fingers of each reflector 3c and 3d is set to 40, 60, 80, 100, or 120.

On the other hand, for the second surface acoustic wave resonator filter, a center-to-center distance between the fingers of the IDT electrodes 4a and 4b is preferably about $0.64\lambda$. A center-to-center distance between the fingers of the IDT electrodes 4a and the reflectors 4c is preferably about $0.52\lambda$. A center-to-center distance between the fingers of the IDT electrodes 4b and the reflectors 4d is also preferably about $0.52\lambda$. Like the first surface acoustic wave resonator filter, the number of the fingers of each reflector 4c and 4d is set to 40, 60, 80, 100, or 120.

The first surface acoustic wave resonator filter 3 is connected in parallel to the second surface acoustic wave resonator filter 4. That is, the input IDT electrode 3a of the first surface acoustic wave resonator filter 3 is electrically connected to the input IDT electrode 4a of the second surface acoustic wave resonator filter 4, and then is electrically connected to an input terminal 6. On the other hand, the output IDT electrode 3b of the first surface acoustic wave resonator filter 3 is electrically connected to the output IDT electrode 4b of the second surface acoustic wave resonator filter 4, and then is electrically connected to an output terminal 7.

Figure 2:
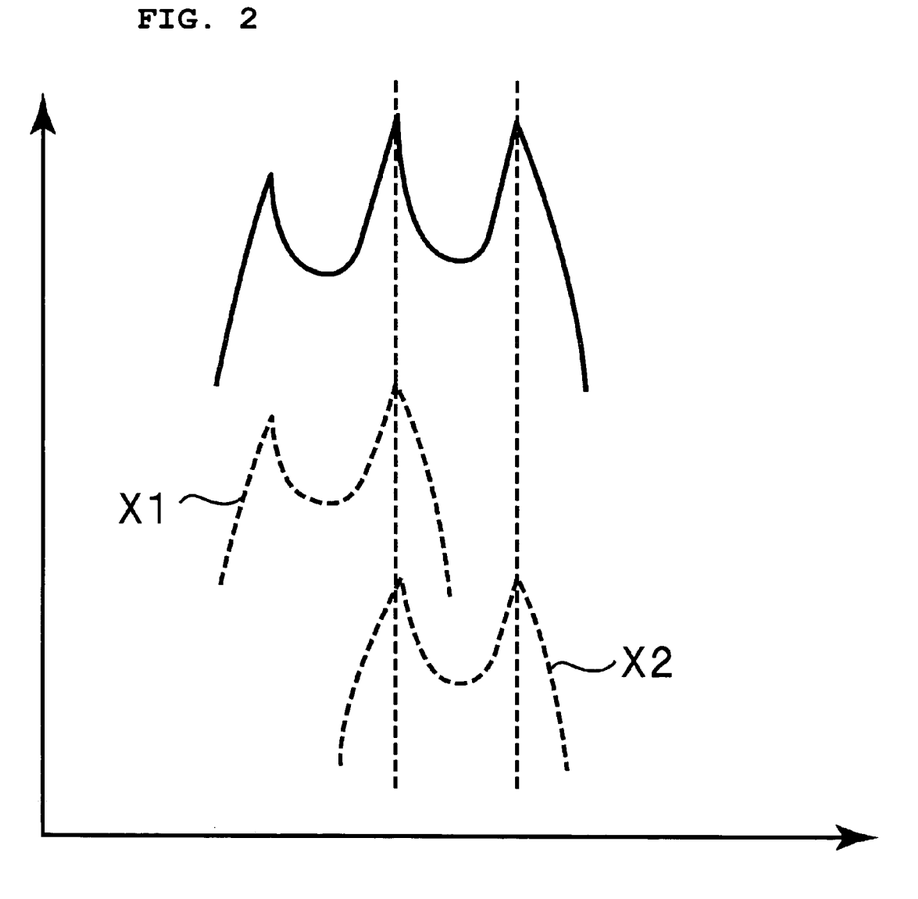
FIG. 2 shows filter characteristics of a first double mode surface acoustic wave resonator filter, a second surface acoustic wave resonator filter, and of a surface acoustic wave device according to the first preferred embodiment of the present invention.

With reference to FIG. 2, filter characteristics of the first and second surface acoustic wave resonator filters 3 and 4 in the surface acoustic wave device 1 are shown by dashed lines X1 and X2, respectively. In FIG. 2, the overall filter characteristic of the surface acoustic wave device 1 is shown by a solid line.

In the surface acoustic wave device 1, the number of fingers of the reflectors 3c, 3d, 4c, and 4d are set to the above-described numbers. These numbers control energy transmittance incident on the reflectors 3c, 3d, 4c, and 4d to reduce the occurrence of the ripple in the passband. The details will be described with reference to FIGS. 2 to 5.

As shown by the dashed lines X1 and X2 in FIG. 2, when the resonant frequencies of the first double-mode surface acoustic wave resonator filter 3 are f1L and f1H (where f1L<f1H) and the resonant frequencies of the second double-mode surface acoustic wave resonator filter 4 are f2L and f2H (where f2L<f2H), f1H=f2L. Therefore, a wide-band filter characteristic shown by the solid line in FIG. 2 is obtained.

Figure 3:
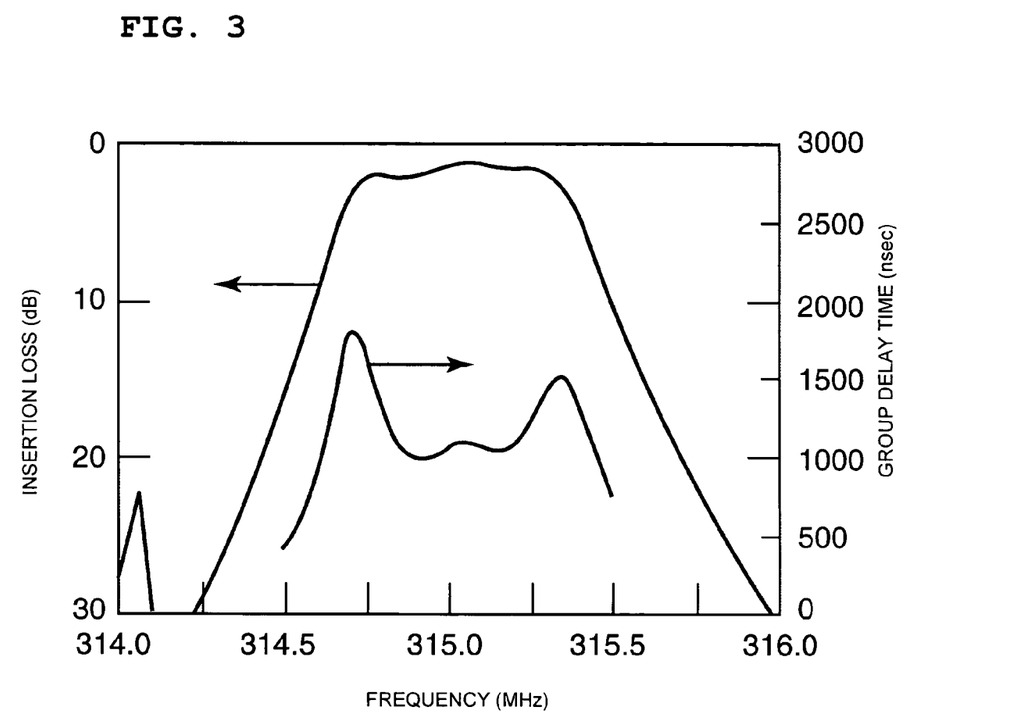
FIG. 3 shows an example of a propagation characteristic of the surface acoustic wave device according to the first preferred embodiment, in which an external element is attached to the surface acoustic wave device for impedance matching and a ripple does not appear in a passband.
Figure 4:
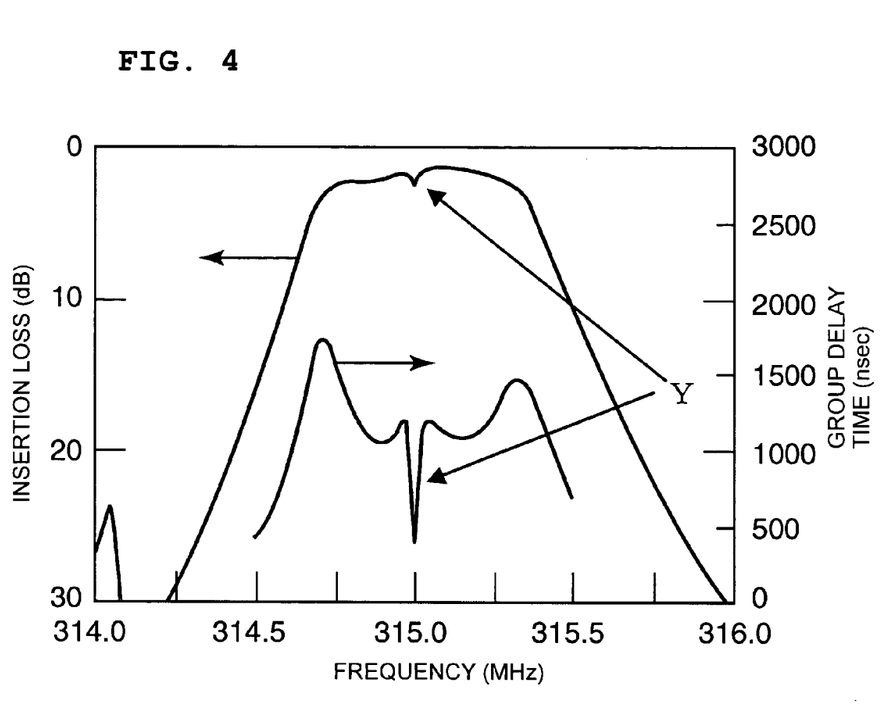
FIG. 4 shows an example of a propagation characteristic of the surface acoustic wave device according to the first preferred embodiment, in which an external element is attached to the surface acoustic wave device for impedance matching and a ripple appears in the passband.

FIGS. 3 and 4 show the propagation characteristics of the surface acoustic wave device 1 with and without structural variations in manufacturing, respectively. In FIGS. 3 and 4, an external element is attached to the surface acoustic wave device 1 for impedance matching.

As can be seen from a comparison of the propagation characteristics in FIGS. 3 and 4, a large ripple occurs, as shown by arrow Y in FIG. 4. The ripple occurs when overlapped resonance points in the filter characteristics of the surface acoustic wave resonator filters 3 and 4, as shown in FIG. 2, are slightly offset from each other due to structural variations in manufacturing.

That is, in an overall propagation characteristic of the surface acoustic wave device 1, discontinuity in phase occurs. Accordingly, the above-described ripple in group delay characteristic, which is one of the propagation characteristics, prominently appears.

Figure 5:
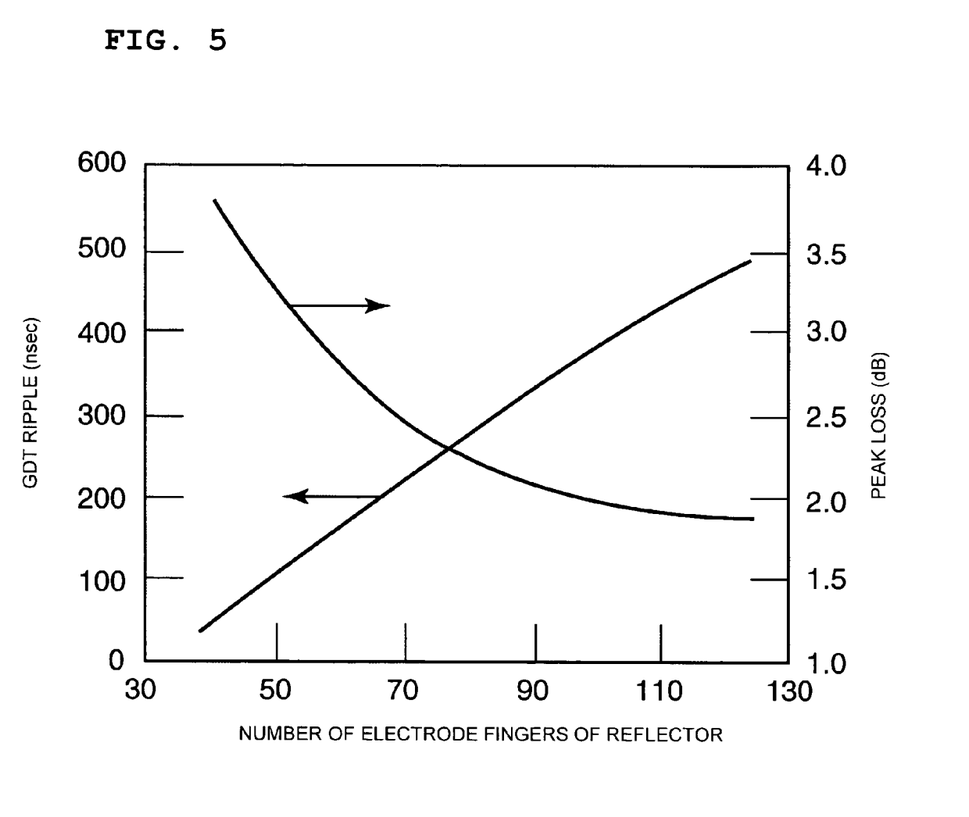
FIG. 5 shows changes of a group delay time ripple and a peak loss when the number of electrode fingers of a grating reflector is modified in the first preferred embodiment of the present invention.

FIG. 5 shows changes of magnitudes of a group delay ripple and a peak loss in the surface acoustic wave device 1 when the number of electrode fingers of the reflector is changed. The term "group delay ripple" as used herein refers to a magnitude of the ripple Y appearing in a passband in the group delay time characteristic, and "peak loss" refers to a minimum value of the insertion loss.

As can be seen from FIG. 5, as the number of electrode fingers of the grating reflectors 3c, 3d, 4c, and 4d decreases a group delay ripple decreases for the following reasons: When the number of electrode fingers of the reflectors is decreased, a surface acoustic wave incident on the reflectors easily passes therethrough. Consequently, mechanical vibration of the surface acoustic wave is not efficiently transformed into electrical energy, thereby decreasing the Q factor of a resonance mode generated by the first and second surface acoustic wave resonator filters 3 and 4. In other words, a modest change in phase causes a modest shift of the resonance mode caused by combining filter characteristics of the first and second surface acoustic wave resonator filters 3 and 4, namely, modest discontinuity of the phase.

On the other hand, reducing the number of electrode fingers of the grating reflectors 3c, 3d, 4c, and 4d decreases efficiency of transformation from mechanical vibration to electrical energy. Accordingly, although the above-described ripple Y is suppressed, a peak loss value is degraded.

As a result, in the surface acoustic wave device 1, the ripple Y is efficiently suppressed by reducing the number of electrode fingers of the grating reflectors 3c, 3d, 4c, and 4d, as is described above, that is, by decreasing the Q factors of resonance modes of the surface acoustic wave resonator filters 3 and 4.

Additionally, FIG. 5 shows that the ripple Y is efficiently suppressed by reducing the electrode fingers of the reflectors to less than or equal to 80 and thereby decreasing the Q factor.

Second Preferred Embodiment

In this preferred embodiment, although the same electrode structure as that of the surface acoustic wave device 1 in the first preferred embodiment is provided on a quartz substrate, a fractional bandwidth of a passband is preferably about 0.18% or about 0.22%.

That is, to set the fractional bandwidth to about 0.18%, a center-to-center distance between an input IDT electrode 3a and an output IDT electrode 3b is preferably set to about 1.17λ, and a distance between the IDT 3a and a reflector 3c and between the IDT 3b and a reflector 3d is preferably set to about 0.48λ.

In a second surface acoustic wave resonator filter, a center-to-center distance between an input IDT electrode 4a and an output IDT electrode 4b is preferably set to about 0.67λ, and a distance between the IDT 4a and a reflector 4c and between the IDT 4b and a reflector 4d is preferably set to about 0.52λ.

On the other hand, to achieve a surface acoustic wave device having a fractional bandwidth of about 0.22%, in the first surface acoustic wave resonator filter 3, a center-to-center distance between an input IDT electrode 3a and an output IDT electrode 3b is preferably set to about 1.09λ, and a distance between the IDT 3a and a reflector 3c and between the IDT 3b and a reflector 3d is preferably set to about 0.52λ.

In the second surface acoustic wave resonator filter 4, a center-to-center distance between an input IDT electrode 4a and an output IDT electrode 4b is preferably set to about 0.64λ, and a distance between the IDT 4a and a reflector 4c and between the IDT 4b and a reflector 4d is preferably set to about 0.52λ.

In the above-described two surface acoustic wave devices, only a fractional bandwidth is changed as compared to the surface acoustic wave device according to the first preferred embodiment of the present invention.

Figure 6:
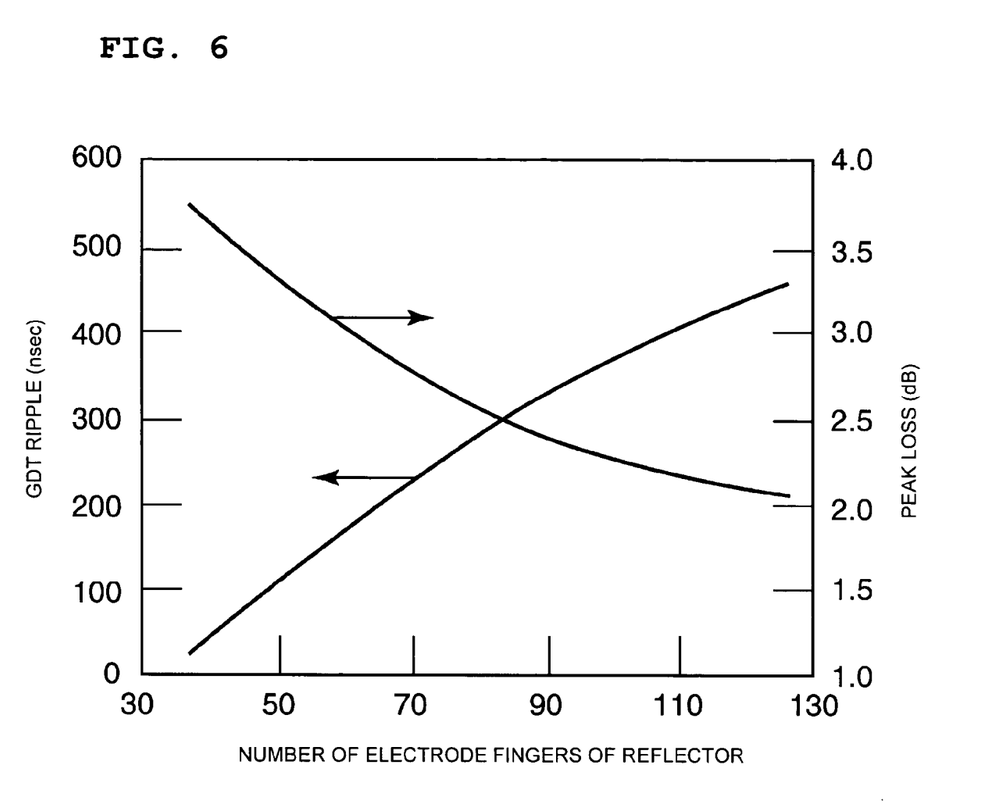
FIG. 6 shows changes of a group delay time ripple and a peak loss in a fractional bandwidth of about 0.18% when the number of electrode fingers of a reflector is modified in a second preferred embodiment of the present invention.
Figure 7:
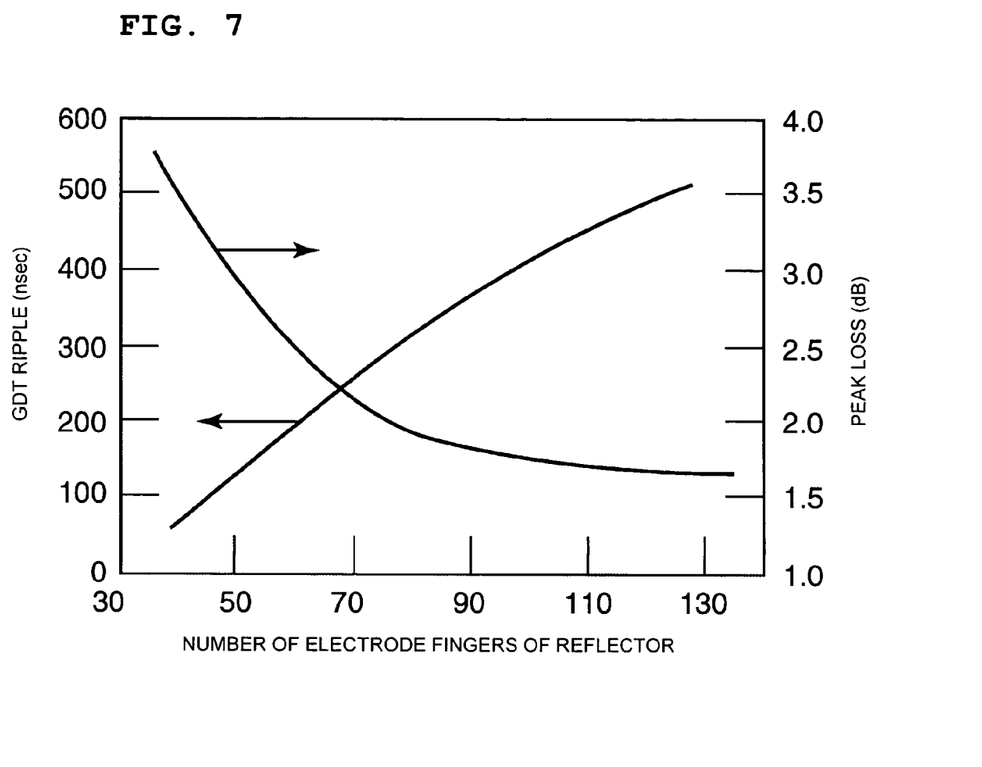
FIG. 7 shows changes of a group delay time ripple and a peak loss in a fractional bandwidth of about 0.22% when the number of electrode fingers of the reflector is modified in the second preferred embodiment of the present invention.

FIGS. 6 and 7 show changes of magnitudes of a group delay ripple and a peak loss in the two surface acoustic wave devices when the number of electrode fingers of the reflector is changed. Similar to the first preferred embodiment, the ripple that occurs in a passband is reduced by reducing the number of electrode fingers of the reflectors to less than or equal to 80 to 90, that is, by decreasing the Q factor.

Third Preferred Embodiment

Figure 8:
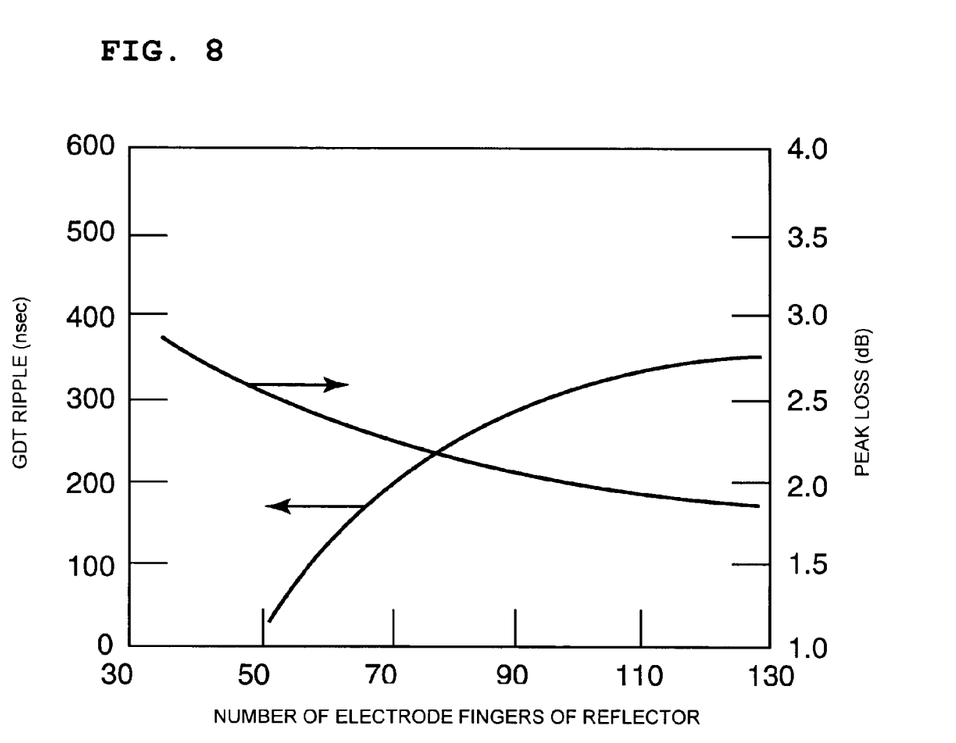
FIG. 8 shows changes of a group delay time ripple and a peak loss when the number of electrode fingers of the reflector is modified in a third preferred embodiment of the present invention.

In this preferred embodiment, in the first surface acoustic wave resonator filter 3, the number of electrode fingers of the grating reflectors 3c and 3d is set to 80 and, in the second surface acoustic wave resonator filter 4, the number of the electrode fingers of the grating reflectors 4c and 4d is set to 40, 60, 80, 100, or 120. That is, energy transmission incident on the reflectors 3c and 3d of the first surface acoustic wave resonator filter 3 remains constant. Then, changes in a group delay time ripple are obtained by changing the number of the electrode fingers of the grating reflectors of the second surface acoustic wave resonator filter. FIG. 8 shows changes of a group delay time ripple and a peak loss when the number of electrode fingers of the reflector in the second surface acoustic wave resonator filter is changed.

As can be seen in FIG. 8, the group delay time ripple is decreased by reducing the number of electrode fingers of the reflectors in the second surface acoustic wave resonator filter 4.

As can be seen from the first to third preferred embodiments, in the surface acoustic wave device 1, in which the first and second surface acoustic wave resonator filters are connected in parallel on a piezoelectric substrate and the resonance points of the first and second surface acoustic wave resonator filters are overlapped, reducing the number of electrode fingers of the reflector in at least one of the surface acoustic wave resonator filters, that is, decreasing the Q factor of the resonance mode reduces a phase change. Therefore, a ripple in a passband is reduced. Herein, reducing the number of electrode fingers of the grating reflectors is identical to increasing a surface wave energy transmittance of the reflectors.

Figure 9:
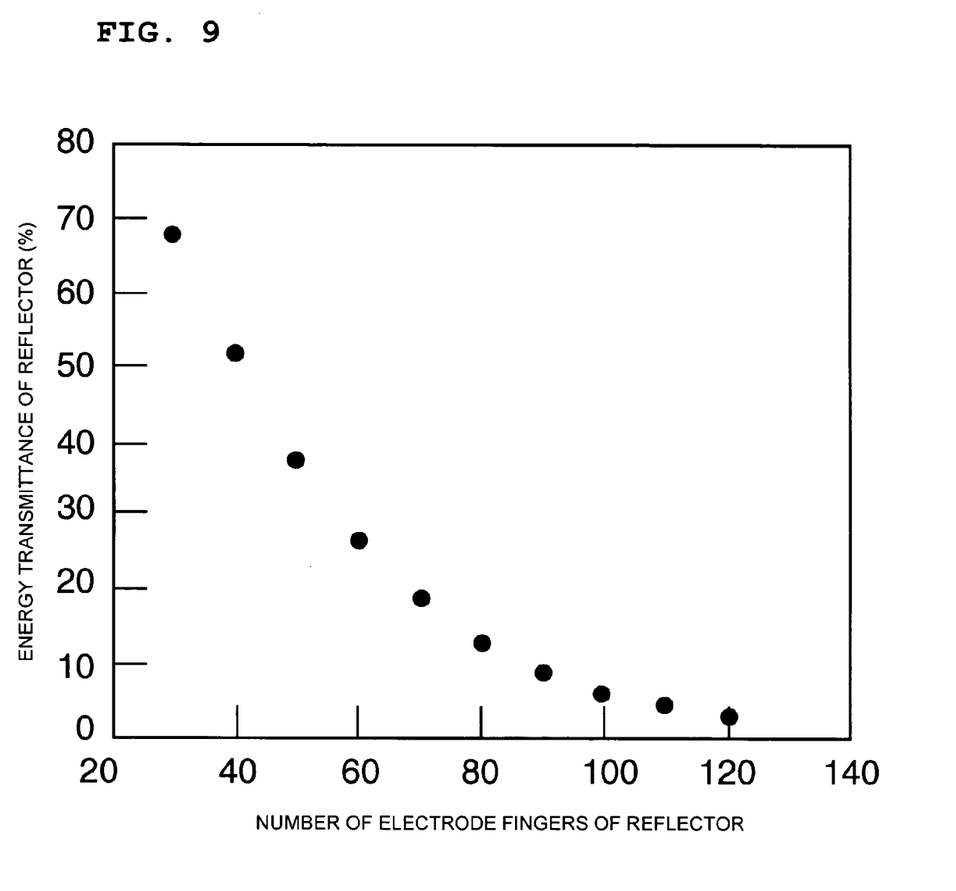
FIG. 9 shows a computational result of a relationship between the number of electrode fingers of the reflectors and the energy transmission passing through the reflectors, according to the results of the first to third preferred embodiments of the present invention.

FIG. 9 shows a computational result of a relationship between the number of electrode fingers of the grating reflectors and the energy transmission passing through the reflectors according to the first to third preferred embodiments.

Generally, for surface acoustic wave filters included in in-car keyless entry systems, an insertion loss less than or equal to about 4 dB and a passband ripple less than or equal to about 1 dB are required in their characteristics. In this case, to satisfy this requirement after considering a variation of the temperature characteristics, an insertion loss less than or equal to about 3 dB and a passband ripple less than or equal to about 0.3 dB are required. Since the passband ripple is primarily dependent on a GDT, the GDT in the passband should be less than or equal to about 300 ns in order to keep the ripple in the passband less than or equal to 0.3 dB. Therefore, for the surface acoustic wave filters included in in-car keyless entry systems, the GDT in the passband must be less than or equal to about 300 ns and the insertion loss must be less than or equal to about 3 dB in their characteristics.

As can be seen from the first to third preferred embodiments, to achieve this goal, the number of electrode fingers of the reflectors ranges from 60 to 80. These values correspond to the range of about 12% to about 28% of the energy transmittance shown in FIG. 9.

According to various preferred embodiments of the present invention, a passband ripple is efficiently suppressed by setting energy transmittance of the grating filters in at least one of the surface acoustic wave resonator filters to about 12% to about 28%.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A surface acoustic wave device comprising:
    first and second double-mode surface acoustic wave resonator filters connected in parallel to each other, each of said first and second double-mode surface acoustic wave resonator filters including a piezoelectric substrate, IDT electrodes and grating reflectors disposed on the piezoelectric substrate; wherein
    the first double-mode surface acoustic wave resonator filter has resonance frequencies f1L and f1H, where f1L<f1H;
    the second double-mode surface acoustic wave resonator filter has resonance frequencies f2L and f2H, where f2L<f2H;
    f1H=f2L; and
    an energy transmittance of the reflectors in at least one of the first and the second double-mode surface acoustic wave resonator filters ranges from about 12% to about 28%.

2. The surface acoustic wave device according to claim 1, wherein a fractional bandwidth that is a ratio of a passband to the center frequency of the passband ranges from about 0.18% to about 0.22%.

3. The surface acoustic wave device according to claim 1, wherein the first double-mode surface acoustic wave resonator filter and the second double-mode surface acoustic wave resonator filter are disposed on the same piezoelectric substrate.

4. The surface acoustic wave device according to claim 1, wherein the piezoelectric substrate is a quartz substrate.

5. The surface acoustic wave device according to claim 1, wherein the piezoelectric substrate is an $LiTaO_3$ substrate.

6. The surface acoustic wave device according to claim 1, wherein the piezoelectric substrate is an $LiNbO_3$ substrate.

7. The surface acoustic wave device according to claim 1, wherein the IDT electrodes and the grating reflectors are made of a thin metal film having a thickness of about 3% of a wavelength of a selected surface acoustic wave.

8. The surface acoustic wave device according to claim 7, wherein the thin metal film primarily includes Al.

9. A surface acoustic wave device comprising:
    first and second double-mode surface acoustic wave resonator filters connected in parallel to each other, each of said first and second double-mode surface acoustic wave resonator filters including a piezoelectric substrate, IDT electrodes disposed on the piezoelectric substrate, and grating reflectors on both sides of a region where the IDT electrodes are disposed in the surface acoustic wave propagation direction; wherein
    the first double-mode surface acoustic wave resonator filter has resonance frequencies f1L and f1H, where f1L<f1H;
    the second double-mode surface acoustic wave resonator filter has resonance frequencies f2L and f2H, where f2L<f2H;
    f1H=f2L; and
    a Q factor of a resonance mode of one of the first and the second double-mode surface acoustic wave resonator filter is less than a Q factor of the other double-mode surface acoustic wave resonator filter.

10. The surface acoustic wave device according to claim 9, wherein a fractional bandwidth that is a ratio of a passband to the center frequency of the passband ranges from 0.18% to 0.22%.

11. The surface acoustic wave device according to claim 9, wherein the first double-mode surface acoustic wave resonator filter and the second double-mode surface acoustic wave resonator filter are disposed on the same piezoelectric substrate.

12. The surface acoustic wave device according to claim 9, wherein the piezoelectric substrate is a quartz substrate.

13. The surface acoustic wave device according to claim 9, wherein the piezoelectric substrate is an $LiTaO_3$ substrate.

14. The surface acoustic wave device according to claim 9, wherein the piezoelectric substrate is an $LiNbO_3$ substrate.

15. The surface acoustic wave device according to claim 9, wherein the IDT electrodes and the grating reflectors are made of a thin metal film having a thickness of about 3% of a wavelength of a selected surface acoustic wave.

16. The surface acoustic wave device according to claim 15, wherein the thin metal film primarily includes Al.

* * * * *